United States Patent
Sugiura

(10) Patent No.: US 9,349,766 B2
(45) Date of Patent: May 24, 2016

(54) SOLID-STATE IMAGING DEVICE

(71) Applicant: Kabushiki Kaisha Toshiba, Minato-ku (JP)

(72) Inventor: Yuki Sugiura, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/453,715

(22) Filed: Aug. 7, 2014

(65) Prior Publication Data

US 2015/0255498 A1    Sep. 10, 2015

(30) Foreign Application Priority Data

Mar. 4, 2014    (JP) .................................. 2014-042132

(51) Int. Cl.
*H01L 31/0232* (2014.01)
*H01L 27/146* (2006.01)
*H01L 27/30* (2006.01)

(52) U.S. Cl.
CPC ...... *H01L 27/14627* (2013.01); *H01L 27/1461* (2013.01); *H01L 27/1464* (2013.01); *H01L 27/14609* (2013.01); *H01L 27/14621* (2013.01); *H01L 27/14623* (2013.01);
(Continued)

(58) Field of Classification Search
CPC ..................... H01L 31/0232; H01L 27/14627; H01L 27/14685; H01L 27/01079
USPC ........................................................ 257/432
See application file for complete search history.

(56) References Cited

U.S. PATENT DOCUMENTS

2007/0290612 A1* 12/2007 Hama ................... H01L 27/322
313/506
2008/0251873 A1* 10/2008 Kasano ............ H01L 27/14621
257/432
2009/0046185 A1* 2/2009 Ota ..................... H04N 5/23232
348/294

(Continued)

FOREIGN PATENT DOCUMENTS

JP    2002-111961    4/2002
JP    2009-130239    6/2009
(Continued)

OTHER PUBLICATIONS

Office Action issued on Dec. 8, 2015 in Taiwanese Patent Application No. 103125681 with English translation.
(Continued)

*Primary Examiner* — Phuc Dang
(74) *Attorney, Agent, or Firm* — Oblon, McClelland, Maier & Neustadt, L.L.P

(57) ABSTRACT

According to one embodiment, a solid-state imaging device includes a semiconductor layer, an organic photoelectric conversion layer, and microlenses. A plurality of photoelectric conversion elements are provided in the semiconductor layer. The organic photoelectric conversion layer is provided on a light receiving surface of the semiconductor layer, absorbs and photoelectrically converts light of a predetermined wavelength region, and transmits light of a wavelength region except for the predetermined wavelength region. The microlenses are provided at positions facing the respective light receiving surfaces of the plurality of photoelectric conversion elements with the organic photoelectric conversion layer interposed therebetween, and concentrate incident light on the photoelectric conversion elements.

17 Claims, 8 Drawing Sheets

(52) U.S. Cl.
CPC ... *H01L 27/14625* (2013.01); *H01L 27/14643* (2013.01); *H01L 27/14665* (2013.01); *H01L 27/307* (2013.01)

(56) References Cited

U.S. PATENT DOCUMENTS

| | | | |
|---|---|---|---|
| 2010/0123070 A1 | 5/2010 | Natori | |
| 2011/0272772 A1* | 11/2011 | Kokubun | H01L 27/14632 257/432 |
| 2015/0091115 A1* | 4/2015 | Lin | H01L 27/1463 257/432 |

FOREIGN PATENT DOCUMENTS

| | | |
|---|---|---|
| JP | 2010-123779 | 6/2010 |
| JP | 2014-7427 | 1/2014 |
| KR | 10-2008-0091023 | 10/2008 |
| KR | 10-2011-0010058 | 1/2011 |

OTHER PUBLICATIONS

Office Action issued in Korean patent Application No. 10-2014-0111555, dated Jan. 5, 2016, with English translation (11 pages).

\* cited by examiner

SOLID-STATE IMAGING DEVICE

CROSS-REFERENCE TO RELATED APPLICATION

This application is based upon and claims the benefit of priority from Japanese Patent Application No. 2014-042132, filed on Mar. 4, 2014; the entire contents of which are incorporated herein by reference.

FIELD

Embodiments described herein relate generally to a solid-state imaging device.

BACKGROUND

Conventionally, a solid-state imaging device includes a plurality of photoelectric conversion elements that photoelectrically convert incident light. Color filters, which selectively transmit any one light among, for example, red light, blue light, and green light, are two-dimensionally arranged on light receiving surfaces of the respective photoelectric conversion elements so as to form a Bayer array.

In recent years, a photoelectric conversion element corresponding to each pixel of a taken image has tended to become small as the size of the solid-state imaging device is reduced. Accordingly, the area of the light receiving surface of each photoelectric conversion element is reduced in the solid-state imaging device. As a result, light-receiving sensitivity is lowered.

DETAILED DESCRIPTION

According to this embodiment, there is provided a solid-state imaging device. The solid-state imaging device includes a semiconductor layer, an organic photoelectric conversion layer, and microlenses. A plurality of photoelectric conversion elements, which photoelectrically convert incident light, are provided in the semiconductor layer. The organic photoelectric conversion layer is provided on a light receiving surface of the semiconductor layer, absorbs and photoelectrically converts light of a predetermined wavelength region, and transmits light of a wavelength region except for the predetermined wavelength region. The microlenses are provided at positions facing light receiving surfaces of the plurality of photoelectric conversion elements with the organic photoelectric conversion layer interposed therebetween, and concentrate incident light on the photoelectric conversion elements.

A solid-state imaging device and a method of manufacturing the solid-state imaging device according to embodiments will be described in detail below with reference to accompanying drawings. Meanwhile, the invention is not limited by these embodiments.

First Embodiment

Figure 1:
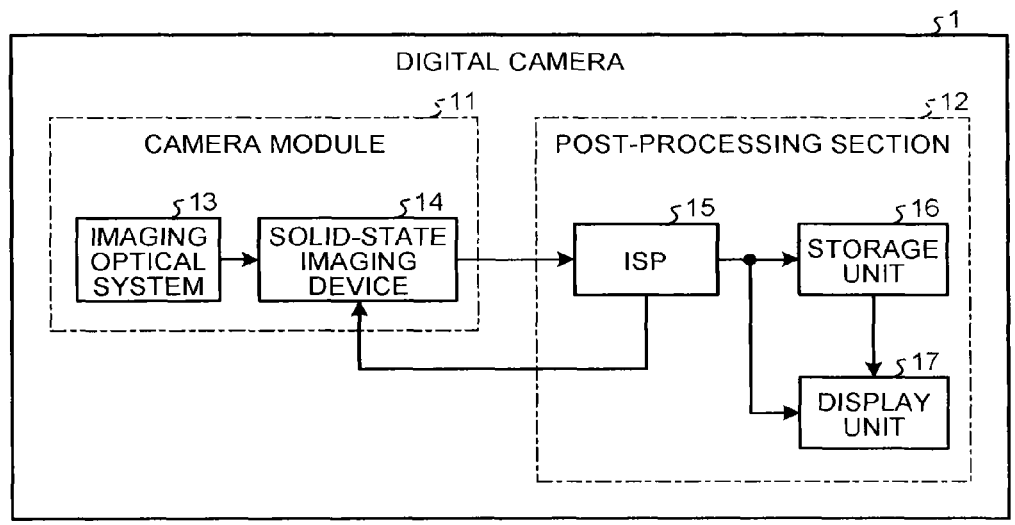
FIG. 1 is a block diagram illustrating the schematic configuration of a digital camera that includes a solid-state imaging device according to a first embodiment.

FIG. 1 is a block diagram illustrating the schematic configuration of a digital camera 1 that includes a solid-state imaging device 14 according to a first embodiment. As illustrated in FIG. 1, the digital camera 1 includes a camera module 11 and a post-processing section 12.

The camera module 11 includes an imaging optical system 13 and a solid-state imaging device 14. The imaging optical system 13 receives light from an object and forms an image of the object. The solid-state imaging device 14 takes the image of the object that is formed by the imaging optical system 13, and outputs image signals, which are obtained from the taking of the image, to the post-processing section 12. The camera module 11 is applied to an electronic device, such as a portable terminal with a camera, other than the digital camera 1.

The post-processing section 12 includes an image signal processor (ISP) 15, a storage unit 16, and a display unit 17. The ISP 15 processes the image signals that are input from the solid-state imaging device 14. The ISP 15 performs high image quality processing, such as noise removal processing, defective pixel correction processing, and resolution conversion processing.

Further, the ISP 15 outputs the image signals, which are after signal processing, to the storage unit 16, the display unit 17, and a signal processing circuit 21 (see FIG. 2) that will be described below and is included in the solid-state imaging device 14 of the camera module 11. Image signals, which are fed back to the camera module 11 from the ISP 15, are used for the adjustment or control of the solid-state imaging device 14.

The storage unit 16 stores the image signals, which are input from the ISP 15, as an image. Further, the storage unit 16 outputs the image signals of the stored image to the display unit 17 according to an operation or the like of a user. The display unit 17 displays an image according to the image signals that are input from the ISP 15 or the storage unit 16. The display unit 17 is, for example, a liquid crystal display or the like.

Figure 2:
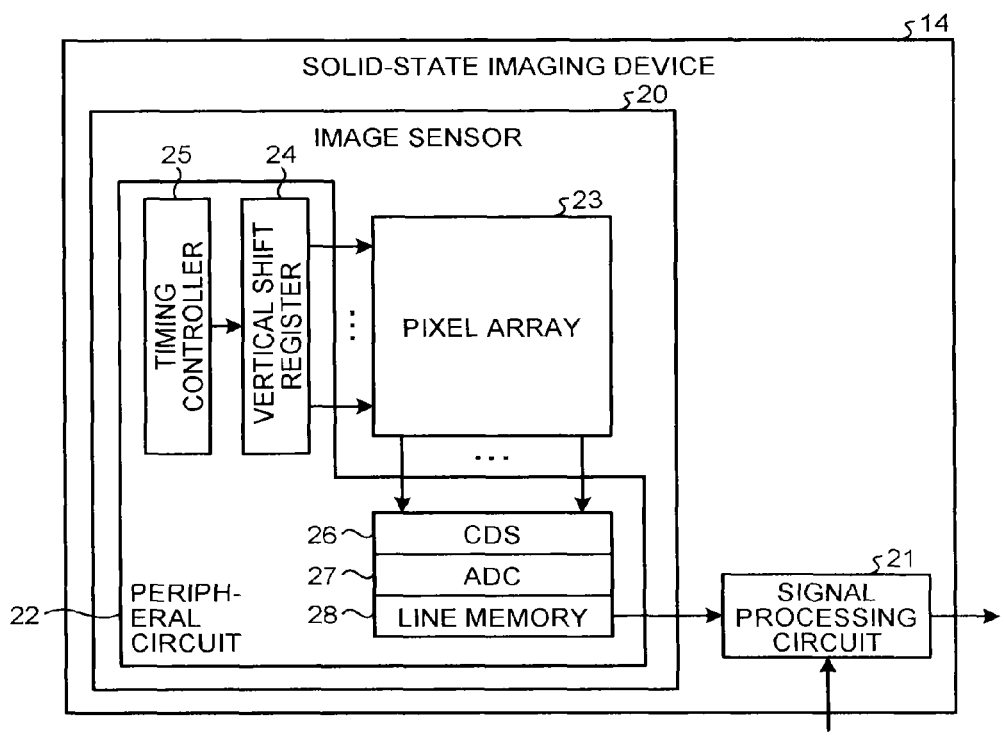
FIG. 2 is a block diagram illustrating the schematic configuration of the solid-state imaging device according to the first embodiment.

Next, the solid-state imaging device 14 included in the camera module 1 will be described with reference to FIG. 2. FIG. 2 is a block diagram illustrating the schematic configuration of the solid-state imaging device 14 according to the first embodiment. As illustrated in FIG. 2, the solid-state imaging device 14 includes an image sensor 20 and a signal processing circuit 21.

Here, a case in which the image sensor 20 is a so-called back-illuminated Complementary Metal Oxide Semiconductor (CMOS) image sensor including a wiring layer formed on the surface, which is opposite to the surface on which incident light is incident, of a photoelectric conversion element photoelectrically converting the incident light will be described.

Meanwhile, the image sensor 20 according to the first embodiment is not limited to the back-illuminated CMOS image sensor, and may be an arbitrary image sensor, such as a front-illuminated CMOS image sensor or a Charge Coupled Device (CCD) image sensor.

The image sensor 20 includes a peripheral circuit 22 and a pixel array 23. Further, the peripheral circuit 22 includes a vertical shift register 24, a timing controller 25, a correlation double sampling (CDS) 26, an analog-digital converter (ADC) 27, and a line memory 28.

The pixel array 23 is provided in an imaging region of the image sensor 20. A plurality of photoelectric conversion elements corresponding to the respective pixels of the taken image is disposed in the pixel array 23. Further, each photoelectric conversion element, which corresponds to each pixel, of the pixel array 23 generates signal charges (for example, electrons) corresponding to the amount of incident light and accumulates the signal charges.

The timing controller 25 is a processing section outputting a pulse signal, which is the reference of an operation timing, to the vertical shift register 24. The vertical shift register 24 is a processing section outputting a selection signal, which is used to sequentially select photoelectric conversion elements reading the signal charges among the plurality of disposed photoelectric conversion elements by a row, to the pixel array 23.

The pixel array 23 outputs the signal charges, which are accumulated in the respective photoelectric conversion elements selected by a row according to the selection signal input from the vertical shift register 24, to the CDS 26 from the photoelectric conversion elements as pixel signals that represent the brightness of the respective pixels.

The CDS 26 is a processing section removing noise from the pixel signals, which are input from the pixel array 23, by correlation double sampling and outputting the pixel signals to the ADC 27. The ADC 27 is a processing section that converts analog pixel signals input from the CDS 26 into digital pixel signals and outputs the digital pixel signals to the line memory 28. The line memory 28 is a processing section that temporarily holds the pixel signals input from the ADC 27 and outputs the pixel signals to the signal processing circuit 21 every row of the photoelectric conversion elements of the pixel array 23.

The signal processing circuit 21 is a processing section that performs predetermined signal processing on the pixel signals input from the line memory 28 and outputs the pixel signals to the post-processing section 12. The signal processing circuit 21 performs signal processing, such as lens shading correction, defect correction, and noise reduction processing, on the pixel signals.

As described above, the plurality of photoelectric conversion elements disposed in the pixel array 23 photoelectrically converts incident light into signal charges corresponding to the amount of received light and accumulates the signal charges, and the peripheral circuit 22 takes an image by reading the signal charges, which are accumulated in the respective photoelectric conversion elements, as pixel signals. As a result, the image sensor 20 takes an image.

The image sensor 20 includes an organic photoelectric conversion layer, which absorbs light (for example, green light) of a predetermined wavelength region and photoelectrically converts the light and transmits light of a wavelength region except for the predetermined wavelength region, on light receiving surfaces of the photoelectric conversion elements that receive the light (for example, blue light or red light) of the wavelength region except for the predetermined wavelength region and photoelectrically convert the light.

The organic photoelectric conversion layer is provided so as to cover the entire region that includes the light receiving surfaces of the plurality of photoelectric conversion elements. Accordingly, in the image sensor 20, the entire surface, on which light is incident, of the organic photoelectric conversion layer that photoelectrically converts, for example, green light serves as a light receiving surface for green light. Therefore, microlenses, which concentrate the green light on the organic photoelectric conversion layer, are not needed in the image sensor 20.

For this reason, in the image sensor 20, spaces in which the microlenses for green light is installed in the past can be used as installation spaces in which microlenses for blue light or red light are installed. Further, in the image sensor 20, microlenses, which concentrate light (for example, blue light or red light) of the wavelength region except for the predetermined wavelength region on the photoelectric conversion elements and have a light receiving area larger than in the related art, are provided on the light receiving surface of the organic photoelectric conversion layer.

According to the image sensor 20, the image sensor 20, for example, receives green light by the entire light receiving surface of the organic photoelectric conversion layer and concentrates red light and blue light on the photoelectric conversion elements by the microlenses that have a light receiving area larger than in the related art. Accordingly, light-receiving sensitivity can be improved.

Figure 3:
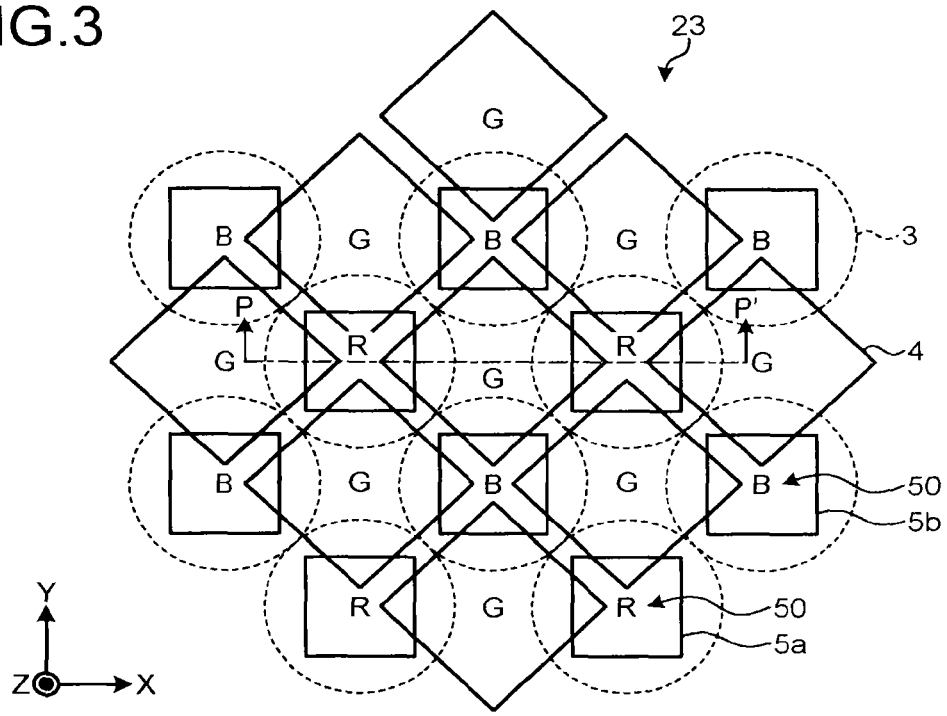
FIG. 3 is a diagram schematically illustrating the upper surface of a pixel array according to the first embodiment.

The pixel array 23 of which light-receiving sensitivity is improved will be described in more detail below. FIG. 3 is a diagram schematically illustrating the upper surface of the pixel array 23 according to the first embodiment. Meanwhile, in FIG. 3, in order to make a positional relationship clear, an X axis, a Y axis, and a Z axis, which are orthogonal to each other, are defined and a positive direction of the Z axis is defined as an upward vertical direction.

As illustrated in FIG. 3, in the pixel array 23, photoelectric conversion elements 5a, which receive red light, and photoelectric conversion elements 5b, which receive blue light, provided in a semiconductor layer are disposed so as to be arranged in a zigzag array in plan view.

Specifically, the photoelectric conversion elements 5a, which are formed in a rectangular shape in plan view, are two-dimensionally arranged in the form of a matrix with a predetermined width interposed therebetween, and the photoelectric conversion elements 5b, which are formed in a rectangular shape in plan view, are disposed at the centers of regions that are surrounded on all four sides by the photoelectric conversion elements 5a, respectively.

Further, in FIG. 3, reference character R is given to the rectangle indicating the photoelectric conversion element 5a receiving red light and reference character B is given to the rectangle indicating the photoelectric conversion element 5b receiving blue light so that a disposition relationship of the respective photoelectric conversion elements 5a and 5b is made clear. Meanwhile, the photoelectric conversion element 5a receiving red light is referred to as a photoelectric conversion element 5a for red, and the photoelectric conversion element 5b receiving blue light is referred to as a photoelectric conversion element 5b for blue.

Figure 4:
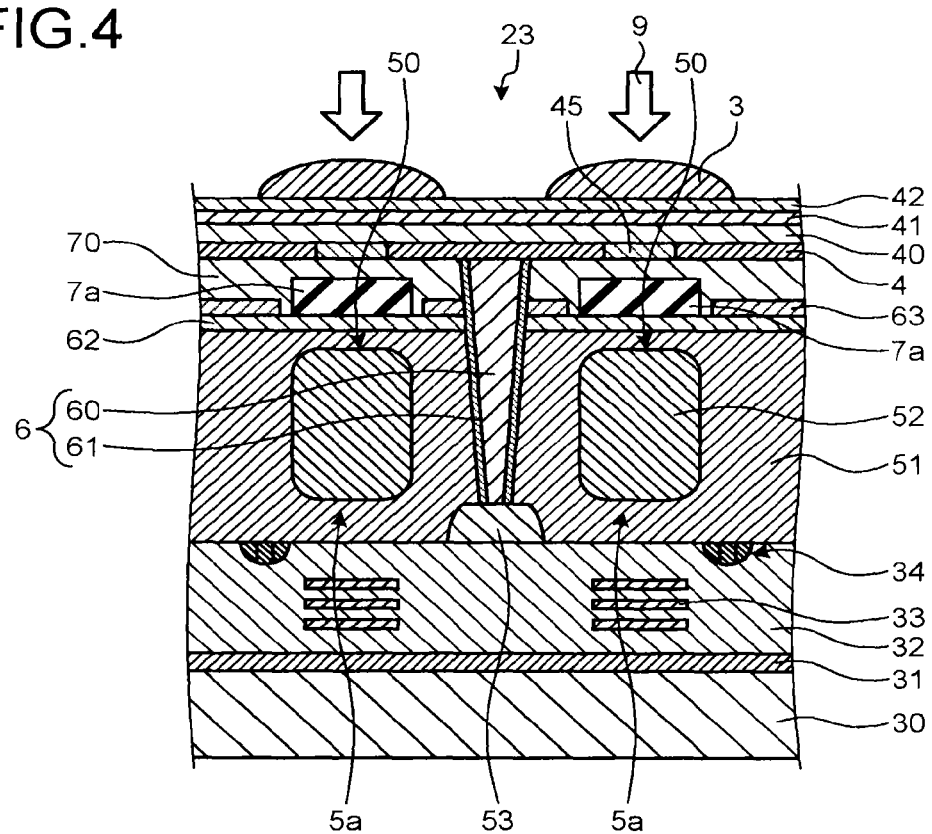
FIG. 4 is a diagram illustrating a cross-section of the pixel array illustrated in FIG. 3 taken along line P-P'.

Furthermore, in the pixel array 23, in the positive direction of the Z axis, color filters, which selectively transmit red light, are provided at positions facing the photoelectric conversion elements 5a for red and color filters, which selectively transmit blue light, are provided at positions, which face the photoelectric conversion elements 5b for blue, in the positive direction of the Z axis. These color filters are not illustrated in FIG. 3 for convenience, and are illustrated in FIG. 4 to be described below.

Moreover, as illustrated in FIG. 3, the pixel array 23 includes lower transparent electrodes 4 that correspond to second transparent electrodes and are provided on the light receiving surfaces 50 of the photoelectric conversion elements 5a and 5b. The lower transparent electrode 4 is a pixel electrode reading signal charges converted by the organic photoelectric conversion layer, which is to be described below and selectively absorbs green light, for each pixel. The organic photoelectric conversion layer is provided as one sheet on the light receiving surfaces of the lower transparent electrodes 4 so as to cover the light receiving surfaces 50 of the respective photoelectric conversion elements 5a and 5b.

That is, the lower transparent electrodes 4 and the organic photoelectric conversion layer, which serve as green pixels, are laminated on the light receiving surfaces 50 of the photoelectric conversion elements 5a as red pixels and the photoelectric conversion elements 5b as blue pixels that are arranged in a zigzag array.

As illustrated in FIG. 3, the lower transparent electrodes 4 are formed in a rectangular shape in plan view and are arranged in a honeycomb array at positions, which face regions surrounded on all four sides by the respective photoelectric conversion elements 5a and 5b, in the positive direction of the Z axis. Specifically, the respective lower transparent electrodes 4 are arranged so that an angle between a diagonal line of the lower transparent electrode 4 parallel to a Y-axis direction and sides of the photoelectric conversion elements 5a and 5b parallel to an X-axis direction is 90°. Meanwhile, reference character G is given to the rectangle indicating the lower transparent electrode 4 in FIG. 3 so that a disposition relationship of the lower transparent electrodes 4 is illustrated.

The center of each of the lower transparent electrodes 4, which are disposed in this way, is positioned at the center of the region that is surrounded on all four sides by the respective photoelectric conversion elements 5a and 5b, and the respective vertices of the lower transparent electrodes 4 are positioned on the light receiving surfaces 50 of the photoelectric conversion elements 5a and 5b. That is, a part of four corners of the lower transparent electrodes 4 overlap with a part of the light receiving surfaces 50 of the respective photoelectric conversion elements 5a and 5b. Meanwhile, the light receiving surfaces 50 of the photoelectric conversion elements 5a and 5b mean end faces of the photoelectric conversion elements 5a and 5b on which light is incident.

Further, as illustrated in FIG. 3, the pixel array 23 includes microlenses 3 that concentrate incident light on the respective photoelectric conversion elements 5a and 5b and are provided on the light receiving surface of the organic photoelectric conversion layer at positions, which face the light receiving surfaces 50 of the respective photoelectric conversion elements 5a and 5b, in the positive direction of the Z axis.

Specifically, the microlenses 3, which are formed in a circular shape in plan view, are provided so as to include the light receiving surfaces 50 of the photoelectric conversion elements 5a and 5b therein in plan view. The optical centers of the respective microlenses 3 are positioned at the centers of the light receiving surfaces 50 of the photoelectric conversion elements 5a and 5b, respectively. The outer peripheral edges of the microlenses 3 in which the light receiving surfaces 50 of the photoelectric conversion elements 5a for red are included come into contact with the outer peripheral edges of the microlenses 3 in which the light receiving surfaces 50 of the photoelectric conversion elements 5b for blue are included. That is, the area of the microlens 3 in plan view is larger than the area of the light receiving surface 50 of each of the photoelectric conversion elements 5a and 5b.

As descried above, the microlenses 3 concentrating incident light on the photoelectric conversion elements 5a for red and the microlenses 3 concentrating incident light on the photoelectric conversion elements 5b for blue are provided on the light receiving surface of the organic photoelectric conversion layer.

In the pixel array 23, the organic photoelectric conversion layer is provided as one sheet on the light receiving surfaces of the lower transparent electrodes 4 so as to cover the light receiving surfaces 50 of the respective photoelectric conversion elements 5a and 5b. For this reason, the organic photoelectric conversion layer can easily capture and sense light that is incident on the entire light receiving surface of the pixel array 23. That is, since green light among red light, blue light, and green light can be reliably captured by the organic photoelectric conversion layer in the pixel array 23, green light does not need to be concentrated by the microlenses 3.

Meanwhile, since the photoelectric conversion elements 5a for red and the photoelectric conversion elements 5b for blue are scattered in the semiconductor layer in the pixel array 23, microlenses 3 for red pixels and microlenses 3 for blue pixels are needed to concentrate light on these photoelectric conversion elements 5a and 5b. For this reason, the pixel array 23 includes the microlenses 3 for red pixels and the microlenses 3 for blue pixels that are provided on the light receiving surface of the organic photoelectric conversion layer.

Accordingly, in the pixel array 23, a region can be sufficiently used for the installation of the microlenses 3 for red pixels and the microlenses 3 for blue pixels in an installation region of the microlenses 3 on the light receiving surface of the organic photoelectric conversion layer. Therefore, the installation area of the microlenses 3, which are provided at positions facing the respective photoelectric conversion elements 5a and 5b, can be set to be large in the pixel array 23.

Specifically, since the microlenses are installed at the positions corresponding to the respective pixels in the pixel array in which the red pixels, the blue pixels, and the green pixels are arranged in the semiconductor layer so as to form a Bayer array, each microlens comes into contact with the microlenses that are present on all four sides. That is, the microlens cannot be equal to or larger than the light receiving area of the pixel.

Meanwhile, since microlenses for green pixels are not needed in the pixel array 23, the regions of two green pixels disposed at the opposite corners of the Bayer array can be used for the installation of the microlens 3 for a red pixel and the microlens 3 for a blue pixel.

For this reason, since the regions occupied by two green pixels can be used in the pixel array 23, the installation area of the microlenses 3 can be set to a size close to about the double of the installation area of the microlenses that are provided at the positions facing the respective pixels arranged so as to form a Bayer array. Accordingly, the amount of light incident on the light receiving surfaces 50 of the respective photoelectric conversion elements 5a and 5b can be significantly increased in the pixel array 23.

Further, since the lower transparent electrodes 4 are provided in the pixel array 23 at the positions facing the regions that are surrounded on all four sides by the respective photoelectric conversion elements 5a and 5b, the photoelectric conversion elements 5a and 5b are not present on the same plane. Accordingly, the pixel area of the lower transparent electrodes 4 can be set to be large.

Specifically, since four corners of the lower transparent electrodes 4 can overlap with the light receiving surfaces 50 of the photoelectric conversion elements 5a and 5b, the pixel area of the lower transparent electrodes 4 can be set to a size close to about the double of the area of the light receiving surfaces 50 of the respective photoelectric conversion elements 5a and 5b. Accordingly, the amount of signal charges, which are converted by the organic photoelectric conversion layer and are read, can be increased in the pixel array 23.

Furthermore, since the lower transparent electrodes 4 and the organic photoelectric conversion layer serve as green pixels in the pixel array 23, regions being necessary for the installation of green pixels in the semiconductor layer can be effectively used as the installation regions of the photoelectric conversion elements 5a for red and the photoelectric conversion elements 5b for blue.

Since the lower transparent electrodes 4 and the organic photoelectric conversion layer serving as green pixels are provided in the solid-state imaging device 14 even though the size of the pixel array is the same as the size of a pixel array in which the red pixels, the blue pixels, and the green pixels are arranged so as to form a Bayer array, the light-receiving sensitivity of the solid-state imaging device 14 can be improved as compared to that of the solid-state imaging device in the related art.

Next, the cross-sectional constitution of the pixel array 23 according to the first embodiment will be described with reference to FIG. 4. FIG. 4 is a diagram illustrating the cross-section of the pixel array 23 illustrated in FIG. 3 taken along line P-P'.

As illustrated in FIG. 4, the pixel array 23 includes a first conductive type (here, P-type) semiconductor (here, Si: silicon) layer 51. Second conductive type (here, N-type) Si regions 52 are provided in the P-type Si layer 51. In the pixel array 23, photodiodes, which are formed by PN junction between the P-type Si layer 51 and the N-type Si regions 52, serve as the above-mentioned photoelectric conversion elements 5a and 5b.

An insulating film 62 and an insulating layer 70 made of an insulating material having translucency are provided in this order on the surface of the P-type Si layer 51 on which light 9 is incident. Color filters 7a that selectively transmit red light, color filters 7b that selectively transmit blue light, and light shielding members 63 are embedded in the insulating layer 70.

Meanwhile, since a cross-section of a portion in which the color filters 7a of the pixel array 23 are installed immediately above the photoelectric conversion elements 5a is illustrated in FIG. 4, the color filters 7b are not illustrated in FIG. 4. The color filter 7b means a color filter, which selectively transmits blue light, in the following description.

The color filters 7a and 7b are provided at the positions facing the light receiving surfaces 50 of the respective photoelectric conversion elements 5a and 5b in the insulating layer 70. Specifically, the color filter 7a, which is formed in a rectangular shape in plan view, is provided on the upper surface of the insulating film 62 so as to cover the entire light receiving surface 50 of the photoelectric conversion element 5a. Further, the color filter 7b, which is formed in a rectangular shape in plan view, is provided on the upper surface of the insulating film 62 so as to cover the entire light receiving surface 50 of the photoelectric conversion element 5b.

The light shielding members 63 are provided at positions facing regions, which are surrounded on all four sides by the respective photoelectric conversion elements 5a and 5b, of the insulating layer 70, respectively. The light shielding member 63 suppresses so-called optical color mixture that is caused when light 9 obliquely passes through the microlens 3 is incident on the light receiving surfaces 50 of the adjacent photoelectric conversion elements 5a and 5b.

Furthermore, the lower transparent electrodes 4, an organic photoelectric conversion layer 40, and an upper transparent electrode 41 corresponding to a first transparent electrode are formed in this order on the surface of the insulating layer 70 on which light 9 is incident. Meanwhile, an insulating film 45, which divides the lower transparent electrode 4 as one pixel, is provided between the lower transparent electrodes 4.

The above-mentioned lower transparent electrodes (pixel electrodes) 4 are provided on the surface of the insulating layer 70 on which the light 9 is incident so that a peripheral edge portion of a projection region, which is formed by projecting an image of the lower transparent electrode 4 on the P-type Si layer 51, overlaps with a part of the light receiving surfaces 50 of the photoelectric conversion elements 5a and 5b in plan view. The lower transparent electrode 4 transmits, for example, light 9 of at least red and blue wavelength regions.

The organic photoelectric conversion layer 40 is provided as one sheet on the light receiving surfaces of the lower transparent electrodes 4 so as to cover the light receiving surfaces 50 of the plurality of photoelectric conversion elements 5a and 5b. The organic photoelectric conversion layer 40 absorbs light 9 of, for example, a green wavelength region, generates charges corresponding to the light 9, and transmits light 9 of at least red and blue wavelength regions.

The upper transparent electrode 41 is provided as one sheet on the light receiving surface of the organic photoelectric conversion layer 40 so as to cover the light receiving surfaces 50 of the plurality of photoelectric conversion elements 5a and 5b. The upper transparent electrode 41 transmits light 9 of, for example, at least red, blue, and green wavelength regions. Further, the upper transparent electrode 41 applies a bias voltage, which is supplied from the external, to the organic photoelectric conversion layer 40. Accordingly, charges, which are generated by the organic photoelectric conversion layer 40, are collected by the respective lower transparent electrodes 4.

Furthermore, the pixel array 23 is provided with contact plugs 6 that discharge charges collected by the lower transparent electrodes 4, and storage diodes 53 that hold charges discharged by the contact plugs 6. The contact plug 6 includes a conductive film 60 and an insulating film 61. The storage diode 53 is formed as an N-type Si region on the surface of the P-type Si layer 51 opposite to the side on which light 9 is incident.

The contact plug 6 is positioned in a region that is surrounded on all four sides by the respective photoelectric conversion elements 5a and 5b, and is embedded so as to extend from the surface of the insulating layer 70, on which light 9 is incident, toward the surface of the P-type Si layer 51 opposite to the side, on which light 9 is incident, through the light shielding member 63.

An upper end of the contact plug 6 is electrically connected to the surface of the lower transparent electrode 4 opposite to the side on which light 9 is incident. A lower end of the contact plug 6 is electrically connected to the storage diode 53.

The storage diode 53 functions as a charge holding unit that temporarily holds the charges collected by the lower transparent electrodes 4. Meanwhile, the charges held in the storage diode 53 are transferred to a floating diffusion to be described below.

As described above, in the pixel array 23, the contact plugs 6 and the storage diodes 53 are provided in the regions of the P-type Si layer 51 that are surrounded on all four sides by the respective photoelectric conversion elements 5a and 5b.

Further, the above-mentioned microlenses 3 are provided at the positions, which face the light receiving surfaces 50 of the respective photoelectric conversion elements 5a and 5b, on the light receiving surface of the upper transparent electrode 41 with a waveguide 42, which guides incident light 9 toward the P-type Si layer 51, interposed therebetween.

Furthermore, in the pixel array 23, an insulating layer 32 in which multilayer wiring 33, readout gates 34, and the like are provided, an adhesive layer 31, and a support substrate 30 are provided in this order on the surface of the P-type Si layer 51 opposite to the side on which light 9 is incident.

The multilayer wiring 33 and the like are a part of a constitution that outputs the charges accumulated in the storage diode 53 to the CDS 26 as pixel signals. The constitution will be described below with reference to FIG. 8.

In the pixel array 23, first, light 9, which is concentrated by the respective microlenses 3 and includes red, blue, and green wavelength regions, is incident on the organic photoelectric conversion layer 40. Meanwhile, the organic photoelectric conversion layer 40 also receives light 9 that passes through a space surrounded by the respective microlenses 3 and includes red, blue, and green wavelength regions.

The organic photoelectric conversion layer 40 selectively absorbs light 9 of a green wavelength region, photoelectrically converts the light, and generates charges corresponding to the absorbed light 9. When a bias voltage supplied from the external through the upper transparent electrode 41 is applied to the organic photoelectric conversion layer 40, the charges are collected by each of the lower transparent electrodes 4. The charges collected on the lower transparent electrodes 4 are discharged to the storage diodes 53 through the contact plugs 6.

Meanwhile, light 9, which includes red and blue wavelength regions, passes through the organic photoelectric conversion layer 40 and is incident on the color filters 7a and 7b that are provided so as to correspond to the respective photoelectric conversion elements 5a and 5b. The color filters 7a selectively transmit light 9 of a red wavelength region. Further, the photoelectric conversion elements 5a photoelectrically convert incident light 9 of a red wavelength region, and accumulate charges corresponding to the amount of incident light. Furthermore, the color filters 7b selectively transmit light 9 of a blue wavelength region. Moreover, the photoelectric conversion elements 5b photoelectrically convert incident light 9 of a blue wavelength region, and accumulate charges corresponding to the amount of incident light.

In the pixel array 23 according to the first embodiment, the organic photoelectric conversion layer 40 selectively absorbing light of a green wavelength region, which does not need to be concentrated by the microlenses 3, is provided on the light receiving surface of the P-type Si layer 51 with the color filters 7a and 7b interposed therebetween.

Accordingly, in the pixel array 23, a region can be sufficiently used for the installation of the microlenses 3 for red pixels and the microlenses 3 for blue pixels in an installation region of the microlenses 3 on the light receiving surface of the organic photoelectric conversion layer 40.

For this reason, the installation area of the microlenses 3, which are provided at the positions facing the respective photoelectric conversion elements 5a and 5b, can be set to be large in the pixel array 23. Accordingly, the amount of light incident on the light receiving surfaces 50 of the photoelectric conversion elements 5a and 5b can be significantly increased.

Further, since the lower transparent electrodes 4 are provided in the pixel array 23 at the positions facing the regions that are surrounded on all four sides by the respective photoelectric conversion elements 5a and 5b, the pixel area of the lower transparent electrodes 4 can be set to be large. Accordingly, the amount of signal charges, which are converted by the organic photoelectric conversion layer 40 and are read, can be increased.

Furthermore, in the pixel array 23, regions being necessary for the installation of green pixels in the P-type Si layer 51 can be effectively used as the installation regions of the photoelectric conversion elements 5a for red and the photoelectric conversion elements 5b for blue. Accordingly, the area of the light receiving surfaces 50 of the respective photoelectric conversion elements 5a and 5b can be increased.

Moreover, in the pixel array 23, the photoelectric conversion elements 5a and 5b are disposed in the P-type Si layer 51 so as to be arranged in a zigzag array in plan view. For this reason, the contact plugs 6 and the storage diodes 53 can be installed in the regions that are surrounded on all four sides by the respective photoelectric conversion elements 5a and 5b disposed in the P-type Si layer 51.

Further, in the pixel array 23, areas occupied in plan view by the contact plug 6 and the storage diode 53 disposed in the P-type Si layer 51 are smaller than the areas of the light receiving surfaces 50 of the photoelectric conversion elements 5a and 5b, respectively. For this reason, the area of the light receiving surfaces 50 of the respective photoelectric conversion elements 5a and 5b can be increased using an empty region around the contact plug 6 and the storage diode 53 that are disposed in the P-type Si layer 51.

Next, a method of manufacturing the solid-state imaging device 14, which includes a method of forming the pixel array 23, will be described with reference to FIGS. 5A to 5D, 6A to 6C, and 7A to 7C. Meanwhile, a method of manufacturing other portions of the solid-state imaging device 14 except for the pixel array 23 is the same as a method of manufacturing a general CMOS image sensor. For this reason, a method of manufacturing the pixel array 23 of the solid-state imaging device 14 will be described below.

Figure 5A:
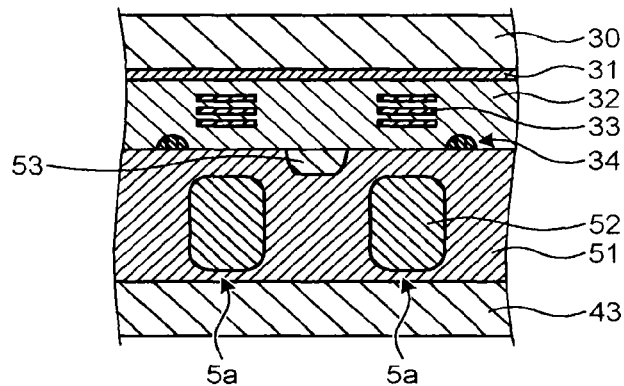
FIGS. 5A to 5D are schematic cross-sectional views illustrating processes for manufacturing the solid-state imaging device according to the first embodiment.

FIGS. 5A to 5D, 6A to 6C, and 7A to 7C are schematic cross-sectional views illustrating processes for manufacturing the solid-state imaging device 14 according to the first embodiment. When the pixel array 23 is to be manufactured, first, the P-type Si layer 51 is formed on a semiconductor substrate 43, such as a Si wafer, by the epitaxial growth of a Si layer doped with a P-type impurity, such as boron, as illustrated in FIG. 5A.

Subsequently, the ion implantation of an N-type impurity, such as phosphorus, and annealing are performed at positions where the photoelectric conversion elements 5a and 5b are formed in the P-type Si layer 51, so that the N-type Si regions 52 are disposed in the P-type Si layer 51 so as to be arranged in a zigzag array. Accordingly, the photoelectric conversion elements 5a and 5b, which are photodiodes, are formed in the pixel array 23 by PN junction between the P-type Si layer 51 and the N-type Si regions 52.

Then, the ion implantation of an N-type impurity, such as phosphorus, and annealing are performed on the inner surface of the P-type Si layer 51, so that the storage diodes 53 and other semiconductor regions, such as floating diffusions to be described below, are formed.

Subsequently, the insulating layer 32 is formed on the P-type Si layer 51 together with the multilayer wiring 33 and the readout gates 34. In this process, a process for forming a Si oxide layer, a process for forming a predetermined wiring pattern on the Si oxide layer, and a process for forming the multilayer wiring 33 by embedding Cu or the like in the wiring pattern are repeated after the readout gates 34 and the like are formed on the upper surface of the P-type Si layer 51. Accordingly, the insulating layer 32 in which the multilayer wiring 33, the readout gates 34, and the like are provided is formed.

Further, an adhesive is applied to the upper surface of the insulating layer 32 to provide the adhesive layer 31, and the support substrate 30, such as a Si wafer, is stuck to the upper surface of the adhesive layer 31. Next, after a structure illustrated in FIG. 5A is turned upside down, the semiconductor substrate 43 is polished from the back surface (here, the upper surface) by a polishing device, such as a grinder, and the thickness of the semiconductor substrate 43 is reduced until the thickness of the semiconductor substrate 43 reaches a predetermined thickness.

Figure 5B:
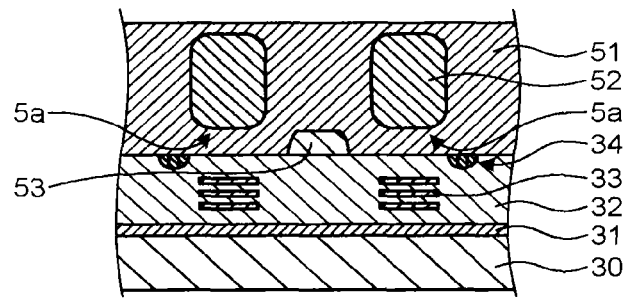

Furthermore, the back surface of the semiconductor substrate 43 is further polished by, for example, Chemical Mechanical Polishing (CMP) so that the back surface (here, the upper surface) of the P-type Si layer 51 serving as the light receiving surface is exposed to the outside as illustrated in FIG. 5B.

Figure 5C:
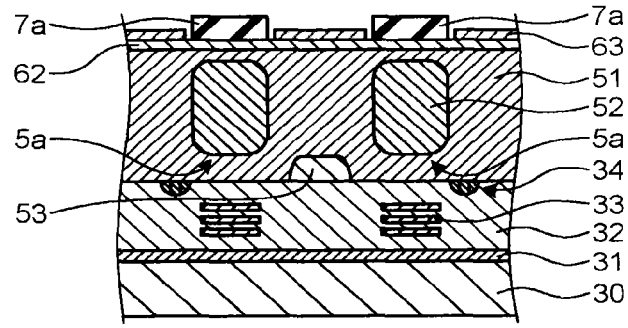

Subsequently, as illustrated in FIG. 5C, the insulating film 62 made of a transparent insulating material, such as SiN, $SiO_2$, HfO, or TaO, is formed on the upper surface of the P-type Si layer 51. Further, the light shielding members 63 made of metal, such as W or Al, are formed at positions, where the light shielding members 63 are formed in the insulating film 62, by patterning.

After that, the color filters 7a and 7b are formed on the insulating film 62 at positions, which face the light receiving surfaces 50 of the respective photoelectric conversion elements 5a and 5b, with pigments or dyes for a red filter and a blue filter by photolithography.

Figure 5D:
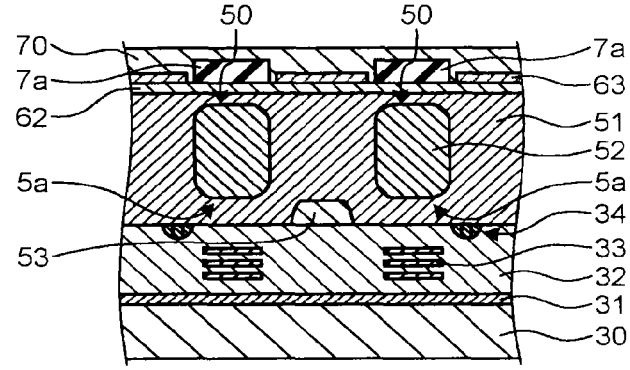

After that, as illustrated in FIG. 5D, the insulating layer 70 made of an insulating material, such as $SiO_2$, is formed on the surfaces of the insulating film 62, the color filters 7a and 7b, and the light shielding member 63 by, for example, a plasma Chemical Vapor Deposition (CVD) method. Accordingly, the color filters 7a and 7b and the light shielding members 63 are embedded in the insulating layer 70.

Figure 6A:
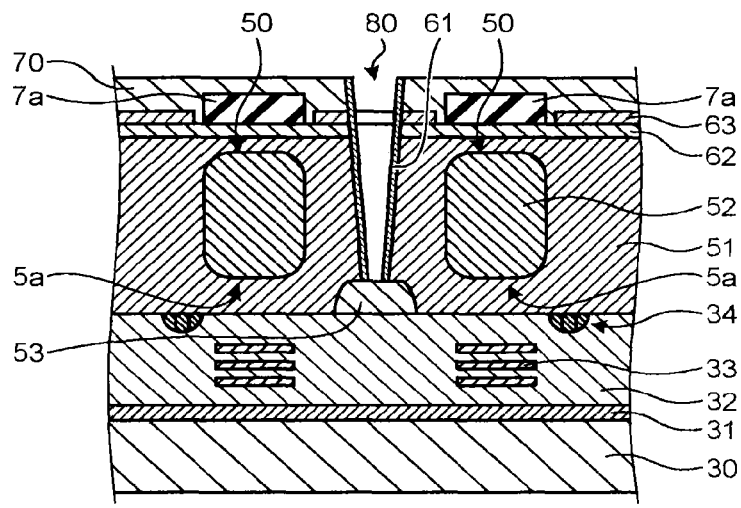
FIGS. 6A to 6C are schematic cross-sectional views illustrating processes for manufacturing the solid-state imaging device according to the first embodiment.

Subsequently, the insulating layer 70, the light shielding members 63, the insulating film 62, and the P-type Si layer 51 are removed up to the upper end of the storage diode 53 at the position, where the contact plug 6 (see FIG. 4) is formed, by Reactive Ion Etching (RIE), so that trenches 80 are formed as illustrated in FIG. 6A.

Since the trenches 80 are formed, a through hole is formed at the center of the surface of each of the light shielding members 63. Further, the insulating film 61 made of an insulating material, such as SiN, is formed on the inner surface of the trench 80 by, for example, a CVD method.

Figure 6B:
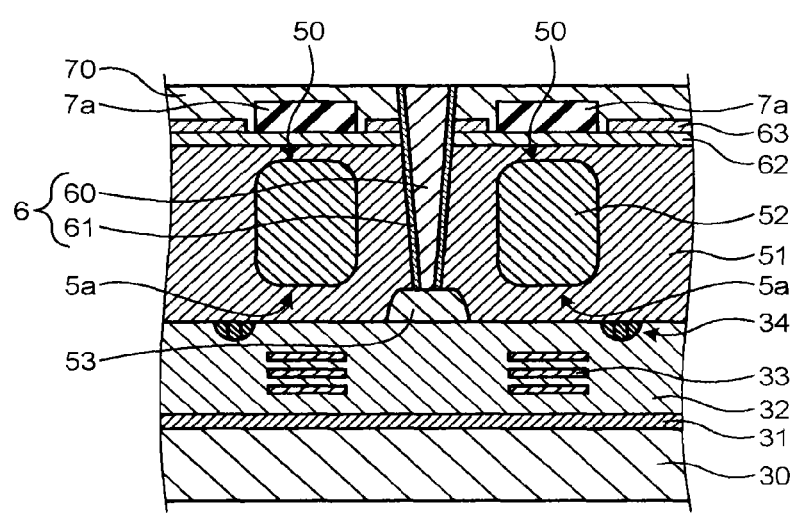

After that, as illustrated in FIG. 6B, the conductive film 60 made of a conductive material, such as Si or W, is embedded in the trench 80 of which the inner surface is coated with the insulating film 61 by, for example, a CVD method.

Figure 6C:
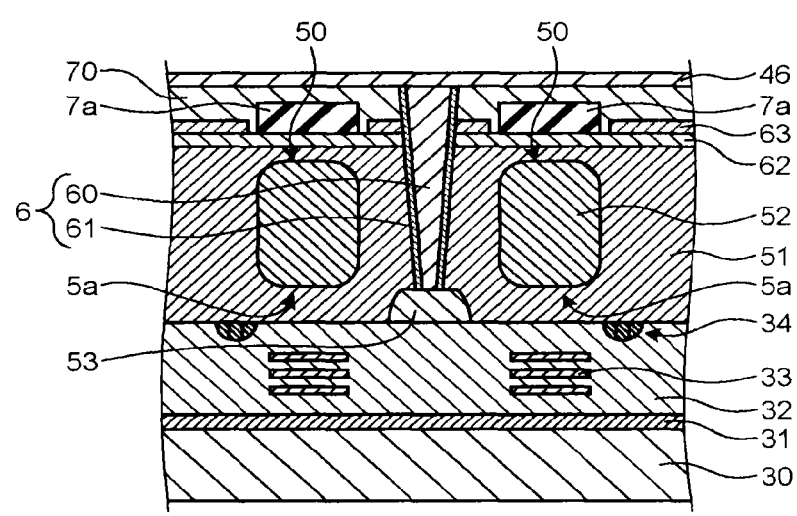

Subsequently, as illustrated in FIG. 6C, a conductive layer 46 made of a transparent conductive material, such as Indium Tin Oxide (ITO) or ZnO, is formed on the upper surface of the insulating layer 70 and the exposed upper surface of the contact plug 6 by, for example, a CVD method.

Figure 7A:
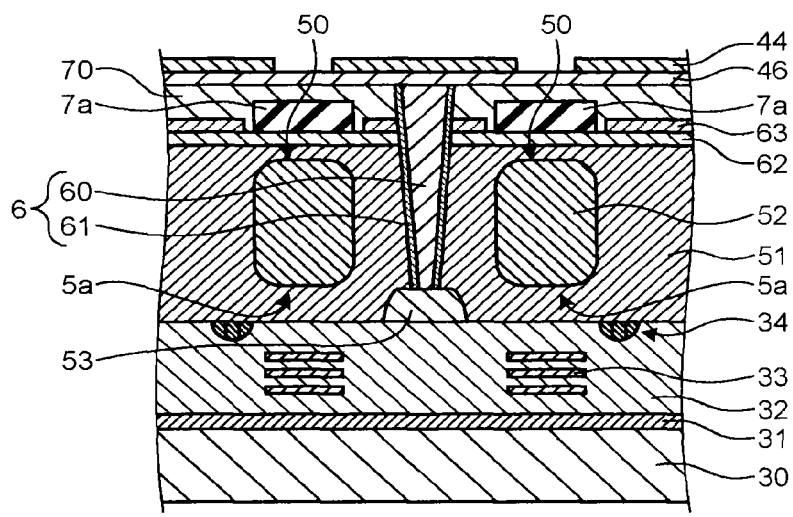
FIGS. 7A to 7C are schematic cross-sectional views illustrating processes for manufacturing the solid-state imaging device according to the first embodiment.

Further, as illustrated in FIG. 7A, for example, a resist 44 is applied to the upper surface of the conductive layer 46, and the resist 44 of portions (see FIGS. 3 and 4) corresponding to positions where the lower transparent electrodes 4 are formed is made to remain and the resist 44 of the other portions is removed by photolithography. Specifically, the resist 44 has openings that are smaller than the light receiving surfaces of the photoelectric conversion elements 5a and 5b or the color filters 7a and 7b in plan view.

Figure 7B:
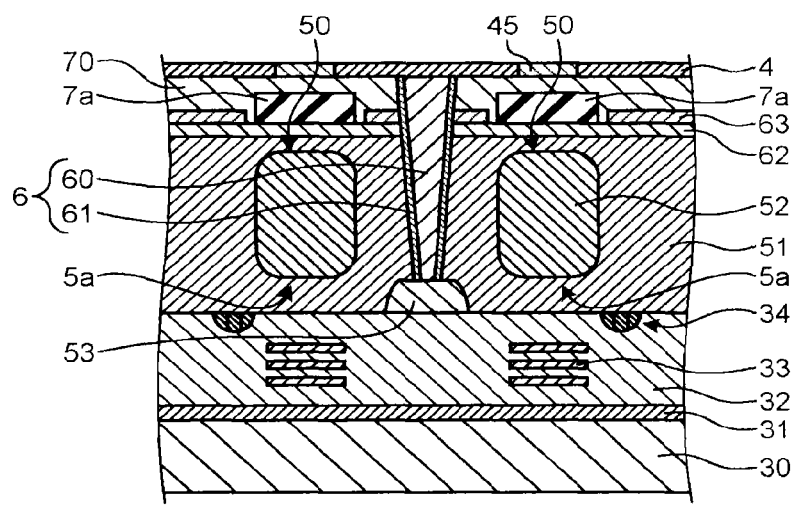

While the resist 44 is used as a mask, for example, RIE is performed to remove the conductive layer 46 of portions that are not covered with the resist 44 as illustrated in FIG. 7B. As a result, the lower transparent electrodes 4 are formed. Then, the resist 44 used as a mask is removed.

Further, the insulating film 45 is formed in an opening, which is formed between the lower transparent electrodes 4 to divide the lower transparent electrode 4 as one pixel, by, for example, a CVD method. In this way, the contact plug 6 is connected to the surface of the lower transparent electrode 4 opposite to the side on which light 9 is incident.

Figure 7C:
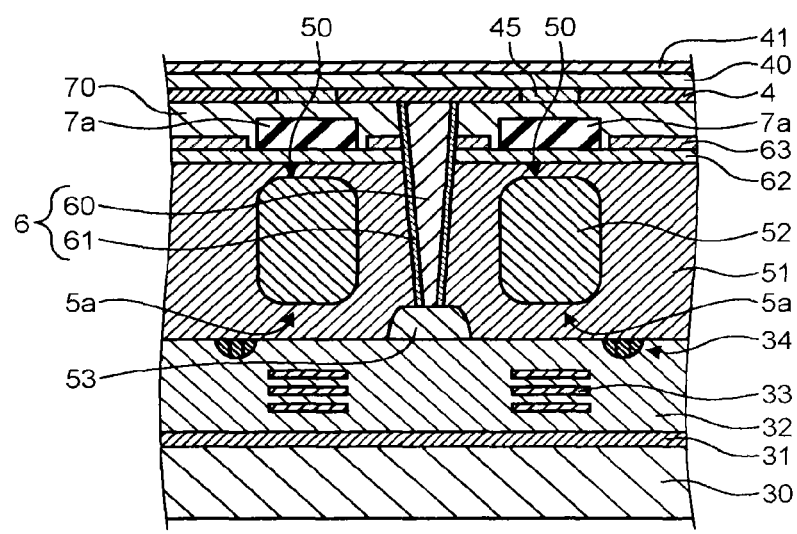

After that, as illustrated in FIG. 7C, the organic photoelectric conversion layer 40 is formed on the upper surface of the lower transparent electrode 4 by, for example, the CVD method. The organic photoelectric conversion layer 40 is made of an organic material having a property of selectively absorbing light of a green wavelength region and transmitting light of other wavelength regions. Then, the upper transparent electrode 41 made of a transparent conductive material, such as Indium Tin Oxide (ITO) or ZnO, is formed on the upper surface of the organic photoelectric conversion layer 40 by, for example, the CVD method.

Further, a waveguide 42 made of, for example, SiN or the like is formed on the upper surface of the upper transparent electrode 41. Then, the microlenses 3 made of, for example, an acrylic organic compound or the like are formed on the upper surface of the waveguide 42, which corresponds to positions facing the respective photoelectric conversion elements 5a and 5b, so as to have a size in which the light receiving surface 50 is included in plan view. As a result, the pixel array 23 illustrated in FIG. 4 is formed.

In this way, in the pixel array 23, the organic photoelectric conversion layer 40 selectively absorbing light 9 of a green wavelength region, which does not need to be concentrated by the microlenses 3, is formed on the light receiving surface of the P-type Si layer 51 with the color filters 7a and 7b interposed therebetween.

Accordingly, in the pixel array 23, a region sufficient for the installation of the microlenses 3 for red pixels and the microlenses 3 for blue pixels can be secured in the installation region of the microlenses 3 on the light receiving surface of the organic photoelectric conversion layer 40.

For this reason, the microlenses 3, which are provided at the positions facing the respective photoelectric conversion elements 5a and 5h, can be formed in a large size in the pixel array 23. Accordingly, the amount of light incident on the light receiving surfaces 50 of the photoelectric conversion elements 5a and 5b can be significantly increased.

Further, since the lower transparent electrodes 4 are formed in the pixel array 23 at the positions facing the regions that are surrounded on all four sides by the respective photoelectric conversion elements 5a and 5b, the lower transparent electrodes 4 can be formed in a large size. Accordingly, the amount of signal charges, which are converted by the organic photoelectric conversion layer 40 and are read, can be increased.

Furthermore, in the pixel array 23, the photoelectric conversion elements 5a and 5b are formed in the P-type Si layer 51 so as to be arranged in a zigzag array in plan view. For this reason, the contact plugs 6 and the storage diodes 53 can be formed in the regions that are surrounded on all four sides by the respective photoelectric conversion elements 5a and 5b provided in the P-type Si layer 51.

Next, the constitution for outputting charges, which are held in the storage diode 53 from the lower transparent electrode 4 through the contact plug 6, to the CDS 26 as pixel signals will be described with reference to FIG. 8.

Figure 8:
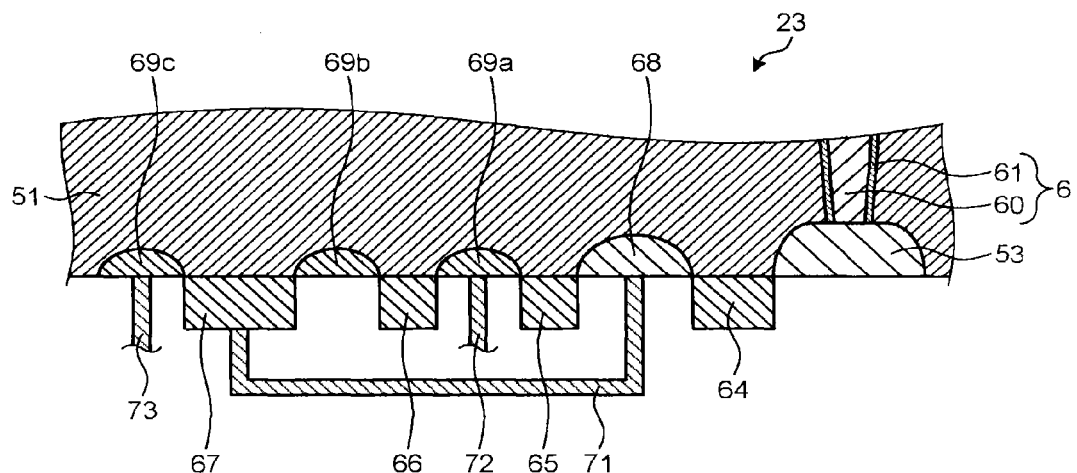
FIG. 8 is a diagram illustrating a part of the constitution of the pixel array according to the first embodiment.

FIG. 8 is a diagram illustrating a part of the constitution of the pixel array 23 according to the first embodiment. Specifically, FIG. 8 illustrates a portion of the insulating layer 32 in which the multilayer wiring 33, the readout gates 34, and the like are embedded in FIG. 4.

As illustrated in FIG. 8, in the pixel array 23, for example, a readout gate (readout electrode) 64, a reset gate 65, an address gate 66, and an amplifying gate 67 are provided on the surface of the P-type Si layer 51 opposite to the side on which light 9 is incident, with an insulating film (not illustrated) interposed therebetween. These gates are made of, for example, polysilicon or the like.

Further, in the pixel array 23, the above-mentioned storage diode 53, a floating diffusion 68, and N-type diffusion regions 69a, 69b, and 69c serving as source/drain are formed in the P-type Si layer 51 on the surface of the P-type Si layer 51 opposite to the side on which light 9 is incident. The storage diode 53, the floating diffusion 68, and the N-type diffusion regions 69a, 69b, and 69c are formed respectively in regions below the surfaces of the photoelectric conversion elements 5a and 5b of the P-type Si layer 51 opposite to the light receiving surfaces 50.

The readout gate 64 is provided between the storage diode 53 and the floating diffusion 68, so that a transfer transistor is constituted. The reset gate 65 is provided between the floating diffusion 68 and the N-type diffusion region 69a, so that a reset transistor is constituted.

The address gate 66 is provided between the N-type diffusion regions 69a and 69b, so that an address transistor is constituted. The amplifying gate 67 is provided between the N-type diffusion regions 69b and 69c, so that an amplifying transistor is constituted.

Further, a wiring 71 connected to the amplifying gate 67 is connected to the floating diffusion 68, a drain line 72 is connected to the N-type diffusion region 69a, and a signal line 73 is connected to the N-type diffusion region 69c. Meanwhile, the wiring 71, the drain line 72, and the signal line 73 correspond to a part of the multilayer wiring 33 that is provided in the insulating layer 32.

The charges collected on the lower transparent electrode 4 are discharged to the storage diode 53 through the contact plug 6. The charges held in the storage diode 53 are transferred to the floating diffusion 68 by the transfer transistor. This transfer operation is performed by the supply of a control signal to the readout gate 64.

The signal charges, which are transferred to the floating diffusion 68, are taken out as amplified signals, which correspond to the amount of signal charges, through the wiring 71 by the amplifying transistor, and are output to the CDS 26 through the signal line 73. This output operation is performed by the input of an address signal to the address transistor.

Meanwhile, the charges, which are accumulated in the photoelectric conversion elements 5a and 5b, are transferred by the readout gate 34 formed on the P-type Si layer 51, and are output to the CDS 26 through the multilayer wiring 33 provided in the insulating layer 32.

Second Embodiment

Next, a second embodiment will be described. In the pixel array 23 according to the first embodiment, the transfer operation for transferring the charges to the floating diffusion 68 from the storage diode 53 is performed using the readout gate 64.

In a pixel array 23a according to the second embodiment, charges are transferred to the floating diffusion 68 from the storage diode 53 by the amplifying transistor without using the readout gate 64. This constitution will be described with reference to FIG. 9.

Figure 9:
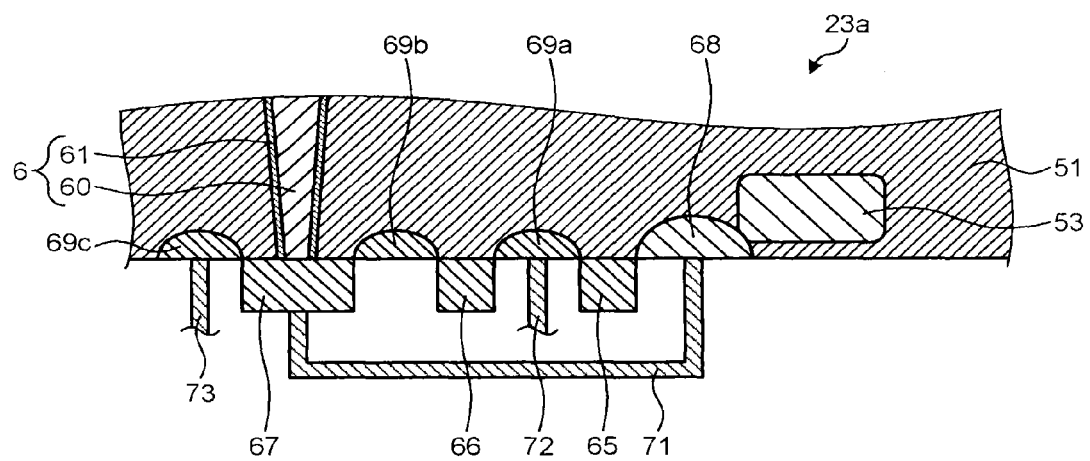
FIG. 9 is a diagram illustrating a part of the constitution of a pixel array according to a second embodiment.

FIG. 9 is a diagram illustrating a part of the constitution of the pixel array 23a according to the second embodiment. Meanwhile, among components illustrated in FIG. 9, components having the same functions as the functions of the components illustrated in FIG. 8 will be denoted by the same reference numerals as the reference numerals illustrated in FIG. 8 and the description thereof will be omitted.

As illustrated in FIG. 9, the constitution of the pixel array 23a is the same as the constitution of the pixel array 23 illustrated in FIG. 8 except that the readout gate 64 is not provided, the contact plug 6 is provided at a position close to the amplifying gate 67, and the storage diode 53 is provided adjacent to the floating diffusion 68.

The charges collected on the lower transparent electrode 4 (see FIG. 4) are discharged to the storage diode 53 through the contact plug 6, a connecting portion (not illustrated), which electrically connects the contact plug 6 to the wiring 71, the wiring 71, and the floating diffusion 68. Meanwhile, the connecting portion (not illustrated) is provided on the back side of the amplifying gate 67 illustrated in FIG. 9.

Further, the charges, which are held in the storage diode 53, are transferred to the floating diffusion 68 by the amplifying transistor. This transfer operation is performed by the supply of a control signal to the amplifying gate 67.

The signal charges, which are transferred to the floating diffusion 68, are further taken out as amplified signals, which correspond to the amount of signal charges, through the wiring 71 by the amplifying transistor, and are output to the CDS 26 through the signal line 73. This output operation is performed by the input of an address signal to the address transistor.

Since the storage diode 53 is provided adjacent to the floating diffusion 68 in the pixel array 23a as described above, the readout gate 64 is not needed. Accordingly, the generation of noise charges caused by the readout gate 64 can be suppressed.

Further, since the contact plug 6 is provided at a position close to the amplifying gate 67 in the pixel array 23a, the discharge of charges to the storage diode 53 from the lower transparent electrode 4 and the takeout of a signal from the floating diffusion 68 can be performed using one wiring 71.

Third Embodiment

Next, a third embodiment will be described. In the pixel array 23 according to the first embodiment, the color filters 7a and 7b are provided at the positions opposite to the side of the organic photoelectric conversion layer 40 on which light 9 is incident. Without being limited to this form, the color filters may be provided at the positions on the side of the organic photoelectric conversion layer 40 on which light 9 is incident.

In this case, yellow (Ye) color filters 8a, which selectively transmit light of red and green wavelength regions, and cyan (Cy) color filters 8b, which selectively transmit light of blue and green wavelength regions, are provided on the light receiving surface of the organic photoelectric conversion layer 40. That is, complementary color filters 8a and 8b are used in a pixel array 23b.

Figure 10:
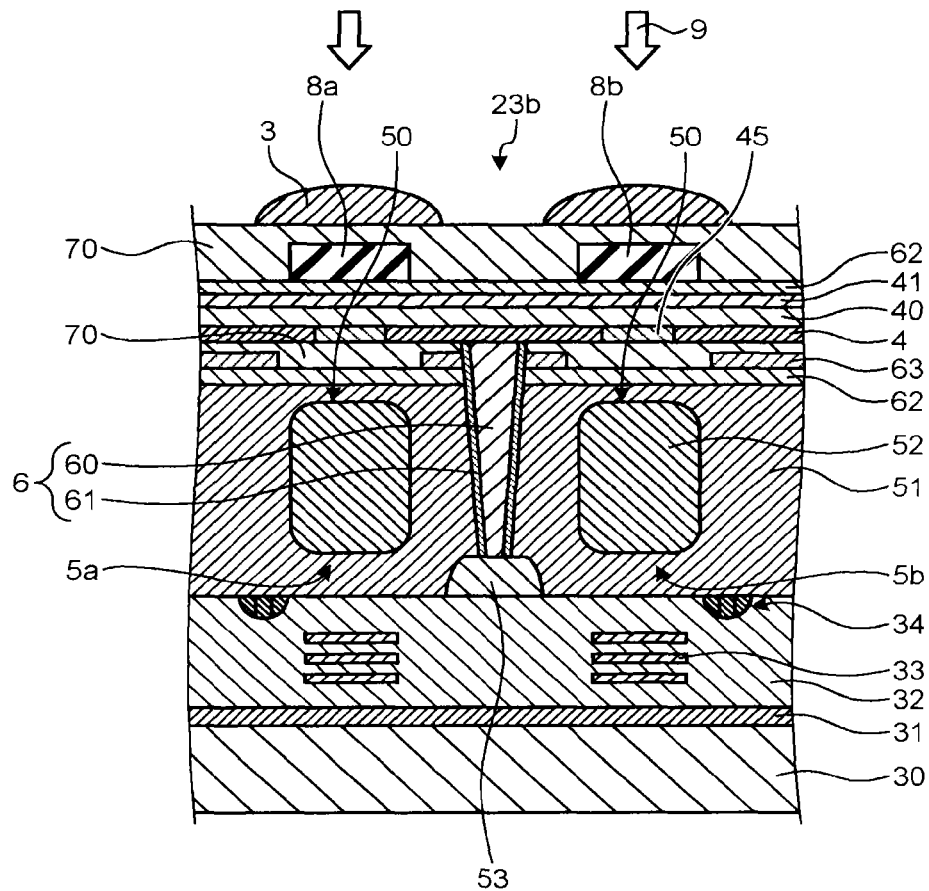
FIG. 10 is a cross-sectional view illustrating a part of an image sensor according to a third embodiment.

FIG. 10 is a cross-sectional view illustrating a part of an image sensor according to the third embodiment. FIG. 10 illustrates a part of the schematic cross-section of the pixel array 23b of a back-illuminated image sensor. Meanwhile, among components illustrated in FIG. 10, components having the same functions as the functions of the components illustrated in FIG. 4 will be denoted by the same reference numerals as the reference numerals illustrated in FIG. 4 and the description thereof will be omitted.

As illustrated in FIG. 10, in the pixel array 23b, the insulating film 62 and the insulating layer 70 in which the yellow color filters 8a and the cyan color filters 8b are embedded are provided in this order on the surface of the upper transparent electrode 41 on which light 9 is incident.

The yellow color filter 8a is provided on the insulating layer 70 at a position facing the photoelectric conversion element 5a for red, and the cyan color filter 8b is provided on the insulating layer 70 at a position facing the photoelectric conversion element 5b for blue.

In the pixel array 23b, light 9 of a green wavelength region of light 9 of red and green wavelength regions, which passes through the yellow color filter 8a, is absorbed by the organic photoelectric conversion layer 40. Further, light 9 of a red wavelength region, which passes through the organic photoelectric conversion layer 40, is incident on the light receiving surface 50 of the photoelectric conversion element 5a.

Furthermore, in the pixel array 23b, light 9 of a green wavelength region of light 9 of blue and green wavelength regions, which passes through the cyan color filter 8b, is absorbed by the organic photoelectric conversion layer 40. Moreover, light 9 of a blue wavelength region, which passes through the organic photoelectric conversion layer 40, is incident on the light receiving surface 50 of the photoelectric conversion element 5b.

Even in a solid-state imaging device 14 including the pixel array 23b according to the third embodiment, the amount of light 9 incident on each pixel or the amount of signal charges, which are read out by the pixel electrode, is increased as in the pixel array 23 according to the first embodiment. Accordingly, light-receiving sensitivity is improved.

Further, in the pixel array 23b according to the third embodiment, it is possible to simply form the color filters 8a and 8b, which are embedded in the insulating layer 70, by forming the color filters 8a and 8b on the light receiving surface of the organic photoelectric conversion layer 40. Accordingly, it is possible to easily manufacture the pixel array 23b.

Fourth Embodiment

Next, a fourth embodiment will be described. In the pixel array 23 according to the first embodiment, the photoelectric conversion elements 5a and 5b, which are formed in a rectangular shape in plan view, are disposed in the P-type Si layer 51 so as to be arranged in a zigzag array in plan view. Without being limited to this form, the photoelectric conversion elements 5a and 5b, which are disposed in the P-type Si layer 51 and are formed in a rectangular shape in plan view, may be alternately arranged at regular intervals in a honeycomb array.

Figure 11:
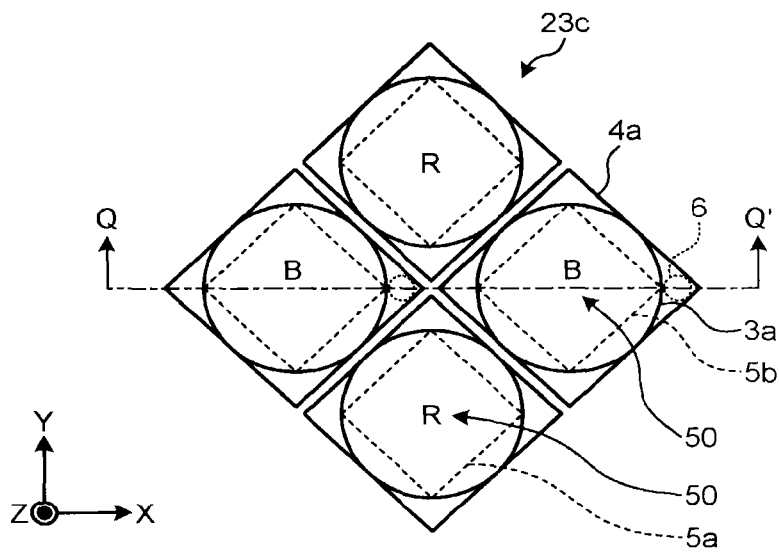
FIG. 11 is a schematic plan view of a pixel array according to a fourth embodiment.

FIG. 11 is a diagram schematically illustrating the upper surface of a pixel array 23c according to the fourth embodiment. As illustrated in FIG. 11, in the pixel array 23c, the photoelectric conversion elements 5a for red and the photoelectric conversion elements 5b for blue are alternately arranged at regular intervals in a honeycomb array in plan view. Further, lower transparent electrodes 4a and microlenses 3a are provided at positions, which face the respective photoelectric conversion elements 5a and 5b, in the positive direction of the Z axis.

The lower transparent electrodes 4a are formed in a rectangular shape in plan view so as to cover the light receiving surfaces 50 of the respective photoelectric conversion elements 5a and 5b, and are disposed so that an angle between a diagonal line of the lower transparent electrode 4a parallel to a Y-axis direction and diagonal lines of the photoelectric conversion elements 5a and 5b parallel to an X-axis direction is 90°. The microlens 3a is formed in a circular shape in plan view so as to be included in the lower transparent electrode 4a.

According to this constitution, in the pixel array 23c, the numbers of red and blue pixels can be increased to the double of the numbers of red and blue pixels of a pixel array in which red, blue, and green pixels are arranged so as to form a Bayer array. Accordingly, the resolution of the red and blue pixels can be raised.

Figure 12:
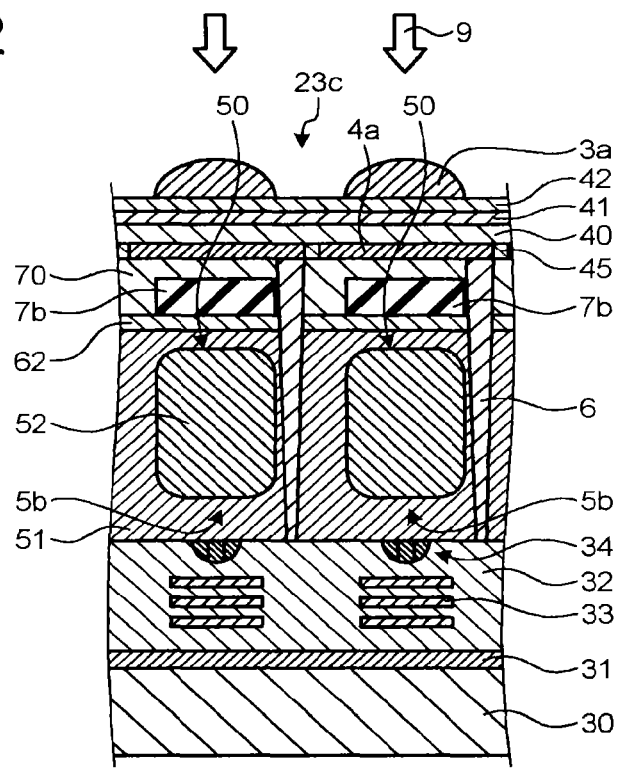
FIG. 12 is a diagram illustrating a cross-section of the pixel array illustrated in FIG. 11 taken along line Q-Q'.

The cross-sectional constitution of the pixel array 23c will be described with reference to FIG. 12. FIG. 12 is a diagram illustrating the cross-section of the pixel array 23c illustrated in FIG. 11 taken along line Q-Q'. Meanwhile, among components illustrated in FIG. 12, components having the same functions as the functions of the components illustrated in FIG. 4 will be denoted by the same reference numerals as the reference numerals illustrated in FIG. 4 and the description thereof will be omitted.

In the pixel array 23c, the photoelectric conversion elements 5a and 5b, which are formed in a rectangular shape in plan view, are alternately arranged at regular intervals in a honeycomb array in plan view. Accordingly, a distance between the respective photoelectric conversion elements 5a and 5b provided in the P-type Si layer 51 is short.

For this reason, in the pixel array 23c, the storage diode 53 is not provided at the lower end of the contact plug 6 that is provided between the respective photoelectric conversion elements 5a and 5b provided in the P-type Si layer 51. That is, the constitution, which does not use the readout gate 64 and has been described with reference to FIG. 9, is employed in the pixel array 23c.

In a solid-state imaging device 14 including the pixel array 23c according to the fourth embodiment, red pixels and blue pixels are alternately arranged at regular intervals in a honeycomb array in plan view and the lower transparent electrodes (pixel electrodes) 4a displaying green are provided at positions facing the respective pixels. Accordingly, light-receiving sensitivity is improved.

Fifth Embodiment

Figure 13:
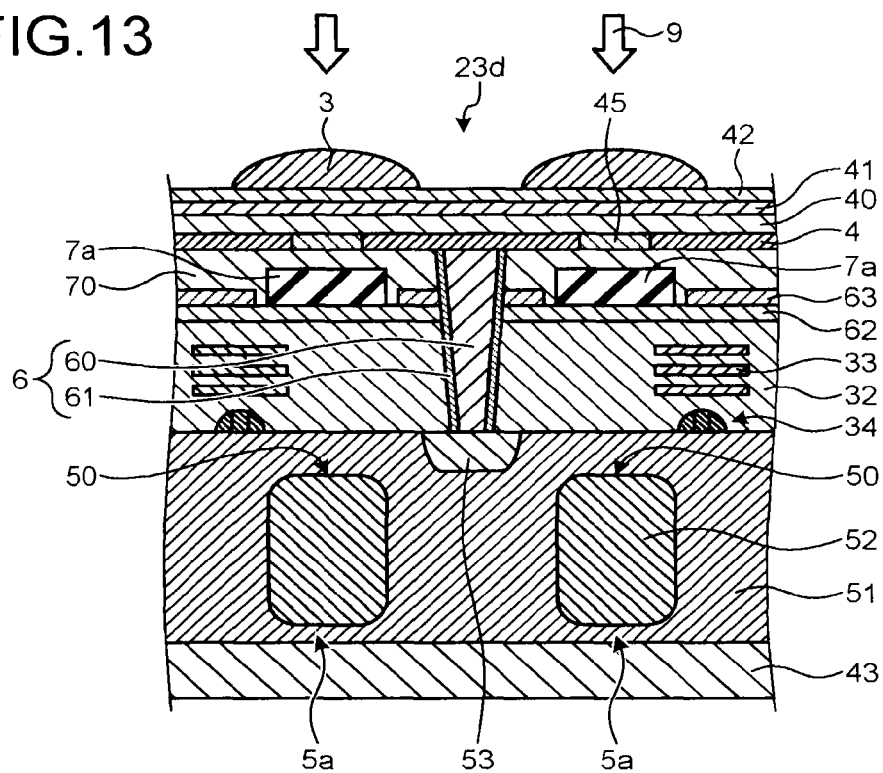
FIG. 13 is a cross-sectional view illustrating a part of an image sensor according to a fifth embodiment.

Next, a fifth embodiment will be described. FIG. 13 is a cross-sectional view illustrating a part of an image sensor according to a fifth embodiment. FIG. 13 illustrates a part of the schematic cross-section of a pixel array 23d of a front-illuminated image sensor. Meanwhile, among components illustrated in FIG. 13, components having the same functions as the functions of the components illustrated in FIG. 4 will be denoted by the same reference numerals as the reference numerals illustrated in FIG. 4 and the description thereof will be omitted.

As illustrated in FIG. 13, the constitution of the pixel array 23d is the same as the constitution of the pixel array 23 illustrated in FIG. 4 except that the P-type Si layer 51 is provided on the semiconductor substrate 43 and the insulating layer 32 in which the multilayer wiring 33, the readout gates 34, and the like are provided is disposed on the light receiving surface (upper surface) of the P-type Si layer 51.

In the pixel array 23d of the front-illuminated image sensor, light 9, which passes through the color filters 7a and 7b, is incident on the light receiving surfaces 50 of the respective photoelectric conversion elements 5a and 5b through the insulating layer 32 in which the multilayer wiring 33, the readout gates 34, and the like are embedded.

Even in a solid-state imaging device 14 including the pixel array 23d according to the fifth embodiment, the amount of light 9 incident on each pixel or the amount of signal charges, which are read out by the pixel electrode, is increased as in the pixel array 23 according to the first embodiment. Accordingly, light-receiving sensitivity is improved.

Meanwhile, in the first, second, third, and fifth embodiments, the organic photoelectric conversion layer 40 is made of a material having a property of selectively absorbing light of a green wavelength region and transmitting light of other wavelength regions. However, the invention is not limited to this constitution.

The organic photoelectric conversion layer 40 may be made of a material having a property of selectively absorbing light of a red wavelength region and transmitting light of other wavelength regions, and may be made of a material having a property of selectively absorbing light of a blue wavelength region and transmitting light of other wavelength regions.

When the organic photoelectric conversion layer 40 is made of a material having a property of selectively absorbing light of a red wavelength region and transmitting light of other wavelength regions, color filters 7 selectively transmitting blue light and color filters 7 selectively transmitting green light are embedded in the insulating layer 70.

Further, when the organic photoelectric conversion layer 40 is made of a material having a property of selectively absorbing light of a blue wavelength region and transmitting light of other wavelength regions, color filters 7 selectively transmitting red light and color filters 7 selectively transmitting green light are embedded in the insulating layer 70.

Furthermore, the P-type Si layer 51 and the N-type Si regions 52 are provided in the first to fifth embodiments, but the pixel array 23 may be constituted using an N-type Si layer 51 and the P-type Si regions 52. In this case, the storage diodes 53 and other semiconductor regions, such as floating diffusions 68, may be constituted as P type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
    a semiconductor layer in which a plurality of photoelectric conversion elements that photoelectrically convert incident light are provided;
    an organic photoelectric conversion layer that is provided on a light receiving surface of the semiconductor layer, that absorbs and photoelectrically converts light of a predetermined wavelength region, and that transmits light of a wavelength region except for the predetermined wavelength region;
    microlenses that are provided at positions facing the light receiving surfaces of the plurality of photoelectric conversion elements with the organic photoelectric conversion layer interposed therebetween, and that concentrate incident light on the photoelectric conversion elements;
    a first transparent electrode that is provided on a light receiving surface of the organic photoelectric conversion layer;
    a plurality of second transparent electrodes that is provided on a surface of the organic photoelectric conversion layer opposite to the light receiving surface,
    wherein the organic photoelectric conversion layer and the first transparent electrode are provided so as to cover a region including the light receiving surfaces of the plurality of photoelectric conversion elements,
    the second transparent electrodes are provided so that a part of a projection region, which is formed by projecting an image of the second transparent electrode on the semiconductor layer, covers a part of the light receiving surface of the adjacent photoelectric conversion element;
    storage diodes that are provided in the semiconductor layer on a surface of the semiconductor layer opposite to the light receiving surface and hold charges collected by the second transparent electrodes;
    contact plugs that are embedded in the semiconductor layer, that connect the second transparent electrodes to the storage diodes, and that discharge the charges to the storage diodes from the second transparent electrodes;
    floating diffusions that are provided in the semiconductor layer on a surface of the semiconductor layer opposite to the light receiving surface and that accumulate the charges transferred from the storage diodes; and
    readout gates that are provided on a surface of the semiconductor layer opposite to the light receiving surface and that transfer the charges to the floating diffusions from the storage diodes.

2. The solid-state imaging device according to claim 1, wherein the organic photoelectric conversion layer absorbs light of the predetermined wavelength region corresponding to green.

3. The solid-state imaging device according to claim 1, wherein an installation area of the microlenses is larger than an area of the light receiving surface of the photoelectric conversion element facing the microlenses.

4. The solid-state imaging device according to claim 1, further comprising:
    color filters that are provided between the semiconductor layer and the organic photoelectric conversion layer at positions facing the respective light receiving surfaces of the plurality of photoelectric conversion elements and that transmit light of a wavelength region except for the predetermined wavelength region.

5. The solid-state imaging device according to claim 1, further comprising:
    light shielding members that are provided on a side, on which light is incident, of regions between the adjacent photoelectric conversion elements of the semiconductor layer and shield light.

6. The solid-state imaging device according to claim 1, further comprising:
    storage diodes that are provided in the semiconductor layer on a side of the semiconductor layer opposite to the light receiving surface and that hold charges collected by the second transparent electrodes;
    floating diffusions that are provided adjacent to the storage diodes and that accumulate the charges transferred from the storage diodes; and amplifying transistors which are provided in the semiconductor layer on a side of the semiconductor layer opposite to the light receiving surface and that amplify charges accumulated in the floating diffusions and of which gates are connected to the floating diffusion through lines.

7. The solid-state imaging device according to claim 1, further comprising:
color filters that are provided at positions facing the respective light receiving surfaces of the plurality of photoelectric conversion elements with the organic photoelectric conversion layer interposed therebetween, and that transmit light of the predetermined wavelength region and light of a wavelength region shorter than the predetermined wavelength region or light of a wavelength region longer than the predetermined wavelength region.

8. The solid-state imaging device according to claim 1, further comprising:
a first transparent electrode that is provided on a light receiving surface of the organic photoelectric conversion layer; and
a plurality of second transparent electrodes that is provided on a surface of the organic photoelectric conversion layer opposite to the light receiving surface,
wherein the organic photoelectric conversion layer and the first transparent electrode are provided so as to cover a region including the light receiving surfaces of the plurality of photoelectric conversion elements, and
the second transparent electrodes are provided at positions facing the respective light receiving surfaces of the plurality of photoelectric conversion elements.

9. The solid-state imaging device according to claim 1, wherein center positions of the microlenses correspond to center positions of the photoelectric conversion elements and the microlenses are provided at positions shifted from center positions of the second transparent electrodes in plan view.

10. A solid-state imaging device comprising:
a semiconductor layer in which a plurality of photoelectric conversion elements that photoelectrically convert incident light is provided;
an organic photoelectric conversion layer that is provided on a light receiving surface of the semiconductor layer, that absorbs and photoelectrically converts light of a predetermined wavelength region, and that transmits light of a wavelength region except for the predetermined wavelength region;
microlenses that are provided at positions facing the light receiving surfaces of the plurality of photoelectric conversion elements with the organic photoelectric conversion layer interposed therebetween, and that concentrate incident light on the photoelectric conversion elements;
a first transparent electrode that is provided on a light receiving surface of the organic photoelectric conversion layer;
a plurality of second transparent electrodes that is provided on a surface of the organic photoelectric conversion layer opposite to the light receiving surface,
wherein the organic photoelectric conversion layer and the first transparent electrode are provided so as to cover a region including the light receiving surfaces of the plurality of photoelectric conversion elements,
the second transparent electrodes are provided so that a part of a projection region, which is formed by projecting an image of the second transparent electrode on the semiconductor layer, covers a part of the light receiving surface of the adjacent photoelectric conversion element;
wherein center positions of the microlenses correspond to center positions of the photoelectric conversion elements and the microlenses are provided at positions shifted from center positions of the second transparent electrodes in plan view.

11. The solid-state imaging device according to claim 10, wherein the organic photoelectric conversion layer absorbs light of the predetermined wavelength region corresponding to green.

12. The solid-state imaging device according to claim 10, wherein an installation area of the microlenses is larger than an area of the light receiving surface of the photoelectric conversion element facing the microlenses.

13. The solid-state imaging device according to claim 10, further comprising:
color filters that are provided between the semiconductor layer and the organic photoelectric conversion layer at positions facing the respective light receiving surfaces of the plurality of photoelectric conversion elements and that transmit light of a wavelength region except for the predetermined wavelength region.

14. The solid-state imaging device according to claim 10, further comprising:
light shielding members that are provided on a side, on which light is incident, of regions between the adjacent photoelectric conversion elements of the semiconductor layer and shield light.

15. The solid-state imaging device according to claim 10, further comprising:
storage diodes that are provided in the semiconductor layer on a side of the semiconductor layer opposite to the light receiving surface and that hold charges collected by the second transparent electrodes;
floating diffusions that are provided adjacent to the storage diodes and that accumulate the charges transferred from the storage diodes; and
amplifying transistors which are provided in the semiconductor layer on a side of the semiconductor layer opposite to the light receiving surface and that amplify charges accumulated in the floating diffusions and of which gates are connected to the floating diffusion through lines.

16. The solid-state imaging device according to claim 10, further comprising:
color filters that are provided at positions facing the respective light receiving surfaces of the plurality of photoelectric conversion elements with the organic photoelectric conversion layer interposed therebetween, and that transmit light of the predetermined wavelength region and light of a wavelength region shorter than the predetermined wavelength region or light of a wavelength region longer than the predetermined wavelength region.

17. The solid-state imaging device according to claim 10, further comprising:
a first transparent electrode that is provided on a light receiving surface of the organic photoelectric conversion layer; and
a plurality of second transparent electrodes that is provided on a surface of the organic photoelectric conversion layer opposite to the light receiving surface,
wherein the organic photoelectric conversion layer and the first transparent electrode are provided so as to cover a region including the light receiving surfaces of the plurality of photoelectric conversion elements, and the second transparent electrodes are provided at positions facing the respective light receiving surfaces of the plurality of photoelectric conversion elements.

* * * * *